United States Patent [19]

van Groningen et al.

[11] Patent Number: 5,063,302
[45] Date of Patent: Nov. 5, 1991

[54] WIDE BAND TRIGGER SYSTEM HAVING SWITCHABLE SIGNAL PATHS FOR EXTENDING THE EFFECTIVE FREQUENCY RANGE

[75] Inventors: Wilhelmus D. H. van Groningen, Eindhoven; Hubertus A. Caris, Enschede, both of Netherlands

[73] Assignee: U.S. Philips Corporation, New York, N.Y.

[21] Appl. No.: 324,377

[22] Filed: Mar. 16, 1989

[30] Foreign Application Priority Data

Mar. 21, 1988 [NL] Netherlands ............... 8800697

[51] Int. Cl.⁵ .............. H03K 5/00; G01R 13/24; H03L 7/00
[52] U.S. Cl. .................. 307/271; 307/522; 328/18; 328/138; 328/140; 328/153; 324/121 R; 315/399
[58] Field of Search .......... 307/271, 273, 241, 242, 307/247.1, 522, 529; 328/60, 61, 71, 109, 136, 138, 140, 14, 16, 15, 18; 377/47; 324/121 R, 77 R, 77 B; 315/399; 358/158; 364/487

[56] References Cited

U.S. PATENT DOCUMENTS

| 3,699,458 | 10/1972 | Martin et al. ............ 328/60 |
| 3,723,898 | 3/1973 | Tewksbury ............ 328/14 |
| 3,906,344 | 9/1975 | Addis et al. ............ 324/121 R |
| 3,943,382 | 3/1976 | Hermansdorfer et al. ...... 328/141 |
| 4,145,660 | 3/1979 | Allen et al. ............ 328/138 |
| 4,366,373 | 12/1982 | Metcalf ............ 377/47 |
| 4,477,920 | 10/1984 | Nygaard et al. ........ 377/56 |
| 4,621,217 | 11/1986 | Saxe et al. ............ 324/121 R |
| 4,651,065 | 3/1987 | Suzuki ............ 315/399 |
| 4,658,406 | 4/1987 | Pappas ............ 377/49 |
| 4,704,691 | 11/1987 | Blair ............ 377/110 |
| 4,851,783 | 7/1989 | Räbiger ............ 328/140 |

Primary Examiner—Stanley D. Miller
Assistant Examiner—Tai V. Duong
Attorney, Agent, or Firm—Bernard Franzblau

[57] ABSTRACT

A triggering system (1) comprises a trigger device (4) to which a trigger input signal is supplied from an input (2) via parallel signal paths (6, 7, 8). One signal path (6) may be a direct connection, while the other signal paths (7, 8) include frequency division devices (10, 13). The signal paths (6, 7, 8) are selectively switched between the input and the trigger device under the control of frequency-dependent switching devices (16, 21) depending on the frequency of a signal obtained from an input signal at the input (2) of the triggering system. As a result, the useful frequency range of the triggering system (1) is extended up to much higher frequencies than would be determined solely by the bandwidth of the trigger device.

18 Claims, 5 Drawing Sheets

WIDE BAND TRIGGER SYSTEM HAVING SWITCHABLE SIGNAL PATHS FOR EXTENDING THE EFFECTIVE FREQUENCY RANGE

BACKGROUND OF THE INVENTION

This invention relates to a triggering system comprising a triggering device for generating triggering pulses from a signal to be supplied repetitively via a signal path to the triggering device.

The invention further relates to an oscilloscope equipped with such a triggering system.

Such a triggering system is described in the manual entitled "Oscilloscopes" by R. van Erk, McGraw-Hill, 1978, ISBN 0-07-067050-1, on pages 72–78. FIG. 3.21 shows a triggering system which is incorporated in an oscilloscope. The triggering system comprises a triggering device which is coupled via a signal path to a signal input of the oscilloscope.

The triggering device has a certain bandwidth and will operate well up to a certain high frequency.

SUMMARY OF THE INVENTION

It is an object of the invention to provide a triggering system which comprises a triggering device having a certain bandwidth and which can operate up to much higher frequencies than would be determined by the bandwidth of the triggering device.

A triggering system according to the invention is characterized in that the triggering system comprises at least one signal path, connected in parallel with the signal path, which is equipped with a frequency division device for dividing the frequency of the signal, the signal paths being switchable. This achieves the result that the triggering system is able to function well up to very high frequencies, far above the bandwidth of the triggering device. Switching can be carried out both manually and automatically. The invention is based on the idea that a triggering system can operate up to much higher frequencies than is determined by the bandwidth of the triggering device as a result of first dividing the frequency of the signal from a certain frequency upwards before supplying the signal to the triggering device. The frequency division device therefore has to operate well up to much higher frequencies than the triggering device.

An embodiment of a triggering system according to the invention is characterized in that the triggering system further comprises at least one frequency dependent switching device for switching the signal paths depending on the frequency of the signal. Automatic switching can consequently take place on the basis of the frequency of the signal.

A further embodiment of a triggering system according to the invention is characterized in that frequency operating ranges of the triggering device and a first frequency division device overlap each other and that a first switching device switches an input signal of the triggering system from a first signal path without a frequency division device to a second signal path containing the first frequency division device, and vice versa, at respective frequencies of the input signal which lie within the overlapping frequency operating ranges. This achieves the result that, when the frequency of the input signal increases, switching takes place before the input signal frequency is outside the bandwidth of the triggering device.

A further embodiment of a triggering system according to the invention is characterized in that frequency operating ranges of the first frequency division device and a second frequency division device overlap each other and that a second switching device switches the input signal from the second signal path to a third signal path containing a second frequency division device, and vice versa, at respective frequencies of the input signal which lie within the overlapping frequency operating ranges. This achieves the result that the triggering system can operate well at still higher frequencies via the third signal path than would be the case via the second signal path.

A further embodiment of a triggering system according to the invention has the characteristic that the frequency division device comprises at least one frequency divider which is connected serially between an input and an output of the frequency division device and which is of a bandpass type. Use is made of commercially available frequency dividers for very high frequencies. These are of a bandpass type. In dimensioning the triggering system, care is taken that the frequency operating ranges of the triggering device and the first frequency division device overlap each other.

A further embodiment of a triggering system according to the invention has the characteristic that the switching device comprises a frequency detection device having an input for receiving a signal formed from the input signal of the triggering system and which has an output for controlling a first and a second switch for switching the parallel signal paths, the frequency detection device exhibiting frequency hysteresis. This achieves the result that, for small variations in the input signal around a switching point of the first and the second signal path, the triggering system does not continuously switch between the signal paths. It is pointed out that frequency detection devices which exhibit hysteresis have in fact been described per se, such as, for example, in the U.S. Pat. No. 3,943,382. The frequency detection device described therein compares a square wave signal formed from a sinusoidal signal with a reference pulse stream. On the basis thereof, the output of the frequency detection device assumes one of two possible states. The frequency detection device according to U.S. Pat. No. 3,943,382 is used to monitor the frequency of a mains voltage, hysteresis being built in to the device in order to trigger, or not trigger, a load if the mains frequency varies, a completely different function to that of the frequency detection device in the triggering system according to the present invention.

A further embodiment of a triggering system according to the invention has the characteristic that the signal supplied to the frequency detection device is formed from an input signal of the triggering device. This achieves the result that, in the state of the switching device in which the second signal path is switched on, the frequency of the input signal is first divided before it is supplied to the frequency detection device. As a result, the frequency detection device can be constructed with components which are required to function well up to lower frequencies than would be the case if the input signal were supplied directly to the frequency detection device.

Dependent 7, 8 and 9 describe further embodiments of the frequency detection device.

An oscilloscope equipped with a triggering system according to the invention will provide a very stable jitter-free image of a repetitive signal up to very high frequencies, even if the frequency of the input signal varies. In order to obtain a stable image in oscilloscopes equipped with a standard triggering system, it will generally be necessary to adjust the triggering system if the frequency of the input signal varies.

BRIEF DESCRIPTION OF THE DRAWING

The invention will be explained in greater detail by reference to the accompanying drawing, in which.

DESCRIPTION OF THE PREFERRED EMBODIMENTS

Figure 1:
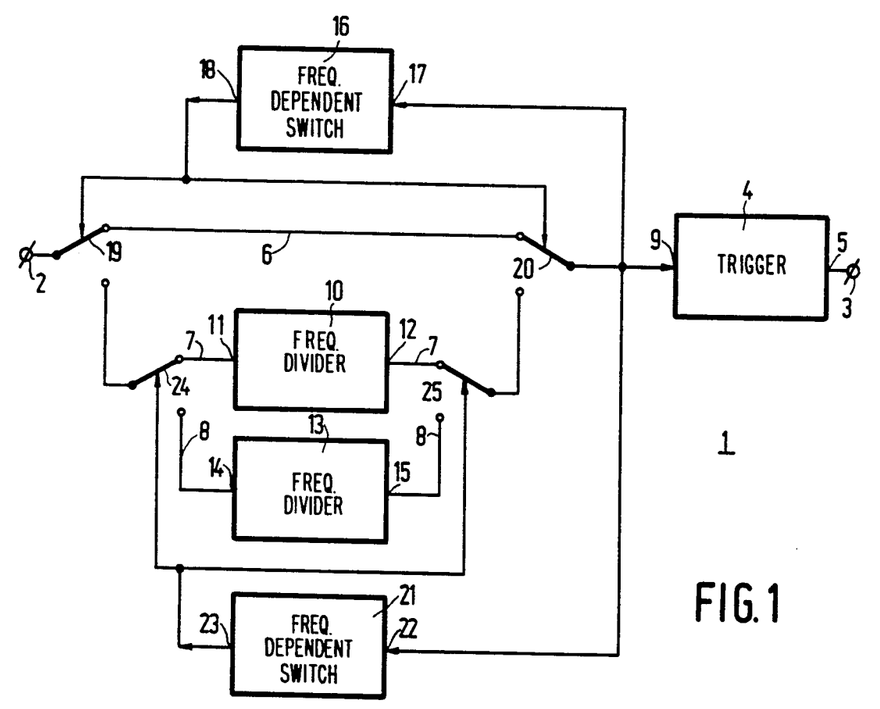
FIG. 1 shows diagrammatically a triggering system according to the invention.

FIG. 1 shows diagrammatically a triggering system 1 according to the invention. The system has an input 2 and an output 3 and further comprises a triggering device 4 whose output 5 is connected to the output 3 of the triggering system. The input 2 can be coupled to an input 9 of the triggering device 4 via a first signal path 6, via a second signal path 7, or optionally via a third signal path 8. In the example shown, the first signal path 6 is a direct connection, but it may also incorporate, for example, an amplifier. The second and the third signal paths 7 and 8 have respectively a first frequency division device 10 having an input 11 and an output 12 and a second frequency division device 13 having an input 14 and an output 15. The triggering system 1 furthermore comprises a first frequency-dependent switching device 16 whose input 17 is coupled to the input 9 and which has an output 18 for triggering switches 19 and 20 for switching the inputs 2 and 9 from the first signal path 6 to the second signal path 7. The triggering system 1 may comprise a second frequency-dependent switching device 21 having an input 22 and an output 23. The output 23 is able to trigger switches 24 and 25 in the manner described for the first frequency-dependent switching device 16. As described, for example, in FIG. 3.22 on page 77 of said manual, the input 2 of the triggering system 1 can receive repetitive signals from a trigger selection circuit. The output 3 of the triggering system can be connected to a sawtooth generator for a time base of an oscilloscope. The trigger selection circuit may, for example, select between two oscilloscope input channels and an external oscilloscope trigger input, as in FIG. 3.22 of said manual.

Figure 2:
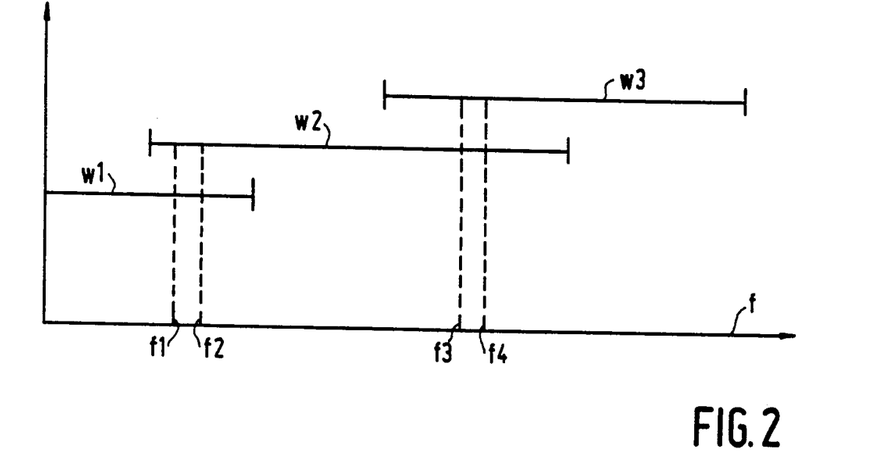
FIG. 2 shows the overlapping of frequency operating ranges of a triggering system, a first frequency division device and a second frequency division device.

FIG. 2 shows an overlapping of frequency operating regions of a triggering device 4, a first frequency division device 10 and a second frequency division device 13 plotted against a frequency f, in which the triggering device 4 has a frequency operating range W1, the first frequency division device 10 has an operating range W2 and the second frequency division device 13 has an operating range W3. In this case, the operating range W1 overlaps the operating range W2 and the operating range W2 overlaps the operating range W3. The frequency operating range W1 extends, for example, from the frequency f=0 to the frequency f=200 MHz, W2 from f=100 MHz to f=2 GHz, and W3 from f=1 GHz to f=10 GHz. The operation of the triggering system is as follows. If the frequency of the signal at the input 2 of the triggering system 1 is lower than f=f1, the signal path 6 is connected to the inputs 2 and 9, if the frequency is between f=f2 and f=f3, the signal path 7 is connected to the inputs 2 and 9, and if the frequency is higher than f=f4, the signal path 8 is connected. In the ranges between f=f1 and f=f2, or f=f3 and f=f4, there is a hysteresis, that is to say, if the frequency increases from f=f1, the switching path 7 is only switched on when f=f2, and if the frequency decreases again, the switching path 6 is only switched on when f=f1.

Figure 3:
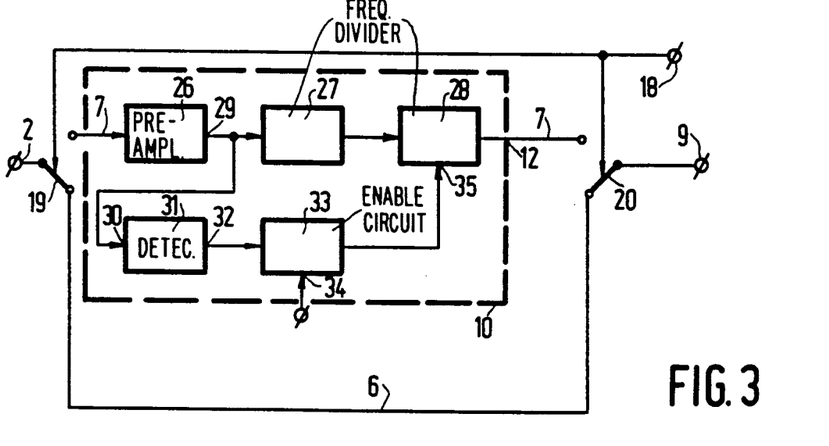
FIG. 3 shows a more detailed diagram of a frequency division device according to the invention.

FIG. 3 shows a more detailed diagram of a frequency division device 10 according to the invention in which components corresponding to FIG. 1 are indicated in the same way. Only the first switching path 6 and the second switching path 7 are shown. The input 11 of the frequency division device 10 in the switching path 7 is connected to the switch 19 and the output 12 is connected to the switch 20. The frequency division device 10 comprises a series circuit of a preamplifier 26, a first frequency divider 27 and a second frequency divider 28. An output 29 of the pre-amplifier 26 is connected with an input 30 of an amplitude detector circuit 31. An output 32 of the amplitude detector circuit 31 is connected to an "enable" circuit 33. The "enable" circuit 33 comprises an "enable" input 34 for transmitting or not transmitting the amplitude detector signal to an "enable" input 35 of the frequency divider 28. The frequency division device 10 has, for example, a bandwidth of f=100 MHz to f=2 GHz. The pre-amplifier 26 may be, for example, a bandwidth amplifier such as an AVANTEK type MSA0304 or MSA0404. The first frequency divider 27 may be, for example, a TELEFUNKEN scale-of-two circuit U862 and the second frequency divider 28 may be, for example, a TELEFUNKEN scale-of-64 circuit U662 such as is used in satellite TV or in tuning circuits. A division by 128 is then achieved in the second signal path. The bandwidth of the triggering device 4 is, for example, 200 MHz. If an input signal on the input is, for example, 2 GHz, division by 128 will give a frequency of approximately 16 MHz, well within the operating range of the triggering device 4. The amplitude detector 31 serves to generate a disable signal if the input signal is too small. The frequency dividers 27 and 28 may start to oscillate in the absence of an input signal or if the input signal is very small. The disable signal disables the frequency divider 28 if the input signal is unduly low, that is to say, the output 12 of the frequency division device 10 is connected to ground-potential, which puts the triggering system 1 out of operation. It may be desired to disregard the disable signal of the amplitude detector for a small signal. The frequency divider 28 then can continue to remain switched on via the input 34.

Figure 4:
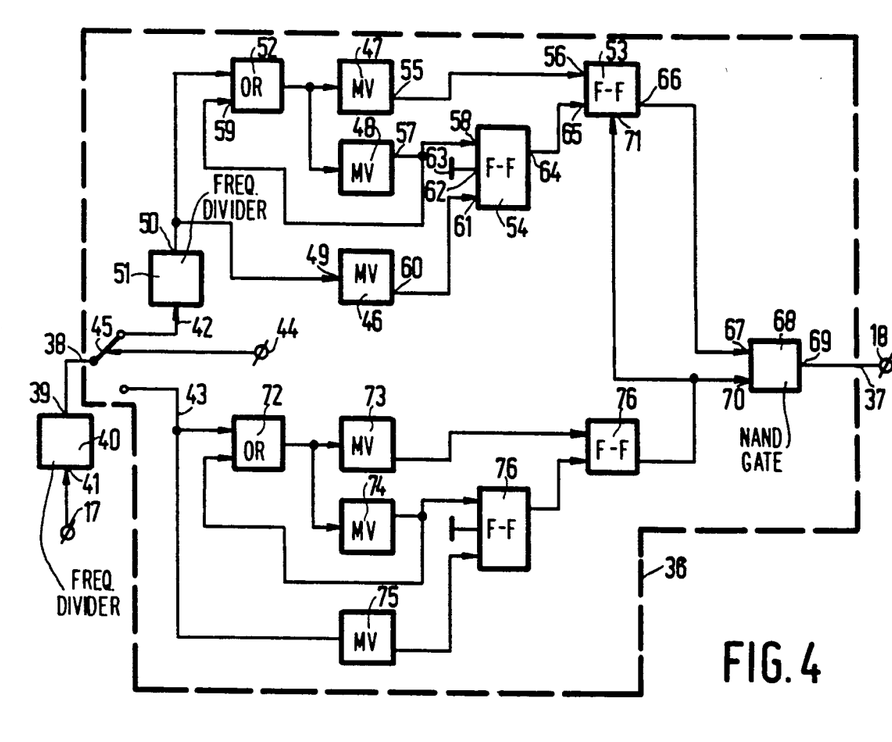
FIG. 4 shows a more detailed diagram of a frequency-dependent switching device according to the invention.

FIG. 4 shows a more detailed diagram of a frequency-dependent switching device 16 according to the invention, in which components corresponding to FIG. 1 are indicated in the same way. The switching device 16 comprises a frequency detection device 36, an output 37 of which is connected to the output 18 and an input 38 of which is connected to the output 39 of a divider circuit 40 whose input 41 is connected to the input 17. The divider circuit 40 comprises, for example, five ECL scale-of-two circuits connected in series, a frequency division by a factor of 32 thereby being achieved. The switching frequencies f1 and f2 are, for example, f1 = 150 MHz and f2 = 160 MHz. If the maximum signal frequency, for example, 2 GHz, is on the input 2 of the triggering system 1, a frequency of 2 GHz divided by 128 will be presented to the switching circuit 16, the frequency detection device 36 then receives 2 GHz divided by 128×32=488 kHz. The frequency detector 36 has a first switching path 42 and a second switching path 43. If f<f1, the first switching path 42 is switched on, if f>f2, the second switching path 43 is switched on. The output 37, which is connected to a control input 44 of a switch 45, provides the mechanism for triggering the respective switching paths 42 and 43. The first switching path 42 comprises a first monostable multivibrator 46, a second multivibrator 47 and a third multivibrator 48. An input 49 of the first multivibrator 46 is coupled to an output 50 of a frequency divider 51. The second and third multivibrators 47 and 48 are connected via an OR gate 52 to the output 50. The first switching path 42 further comprises a first flip-flop 53 and a second flip-flop 54. An inverted output 55 of the second multivibrator 47 is connected to a clock input 56 of the first flip-flop 53. An output 57 of the third multivibrator 48 is connected to an inverted asynchronous set input 58 of the second multivibrator 47 and also to an input 59 of the OR gate 52. An inverted output 60 of the first multivibrator 46 is connected to a clock input 61 of the second flip-flop 54. A data input 62 of the second flip-flop 54 is connected to a ground terminal 63. An output 64 of the second flip-flop 54 is connected to a data input 65 of the first flip-flop 53. An inverted output 66 of the first flip-flop 53 is connected to a first input 67 of a NAND gate 68, an output 69 of which is connected to the output 37. A second input 70 of the NAND gate 68 is connected to an inverted asynchronous reset input 71 of the first flip-flop 53. Apart from the frequency divider 51 and the inverted reset input 71, the second switching path 43 is of identical construction. The second switching path 43 comprises an OR gate 72, monostable vibrators 73, 74 and 75 and the flip-flops 76 and 77.

Figure 5:
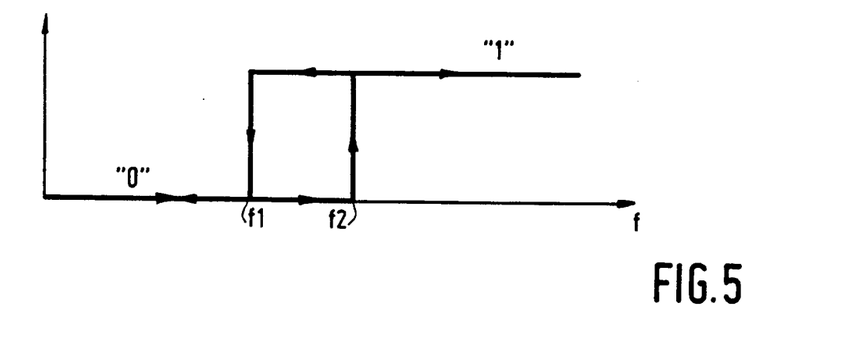
FIG. 5 shows an operating diagram of a frequency detection device according to the invention.

FIG. 5 shows an operating diagram of a frequency detection device according to the invention in which f1 and f2 are switching frequencies. If f<f1, the output 69 of the NAND gate has a first logic level, for example "0", if f>f2, the output 69 changes from "0" to "1" via the first switching path 42, and if f again becomes <f1, the output 69 again assumes the logic level "0". Between f=f1 and f=f2, a hysteresis effect occurs; depending on a preceding state, the output 69 will assume the logic level "0" or "1". The third multivibrator 48 determines a cycle time for the switching of the switching device 16. If the switches are, for example, broadband relays, it has been found that a cycle time of 7 msec is adequate. If electronic switches are used, a shorter cycle time is chosen.

Figure 6:
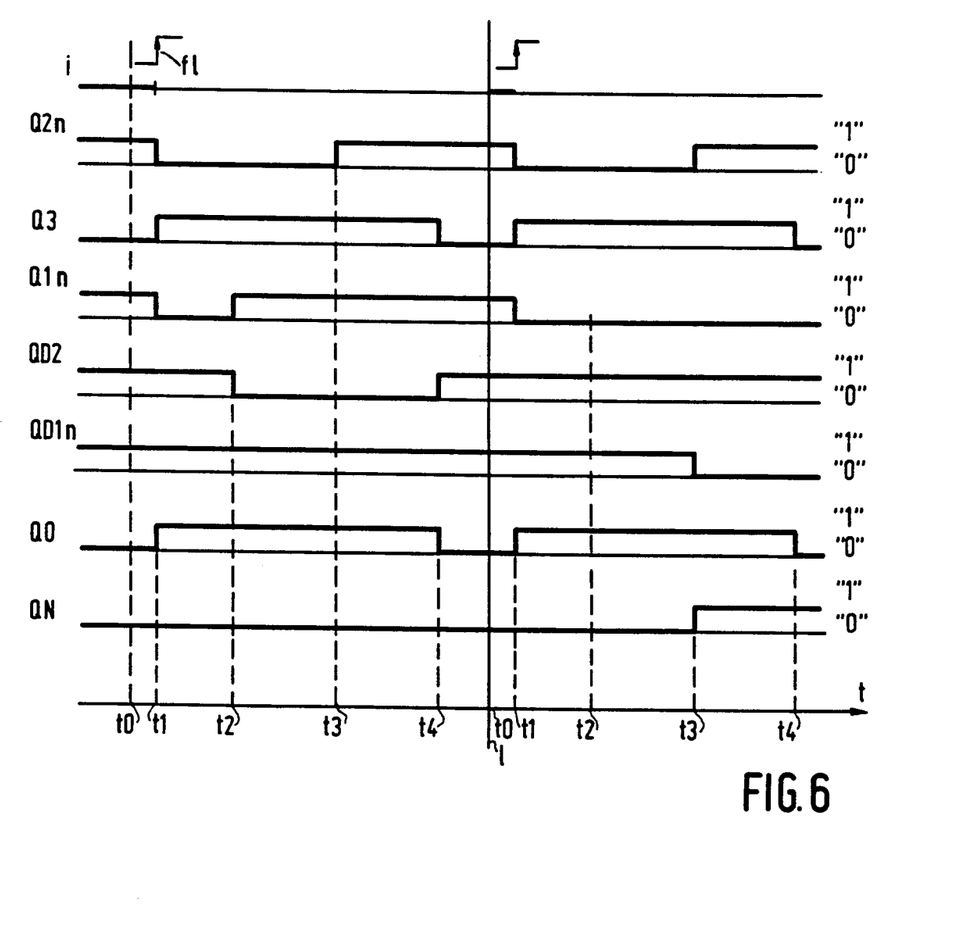
FIG. 6 shows a time sequence diagram to illustrate the operation of the frequency detection device.

FIG. 6 shows a time sequence diagram to illustrate the operation of the frequency detection device 36. Shown as a function of the time t are an input signal i on the input 38 of the frequency detection device 36, an output signal Q2n (Q2 inverted) on the output 55 of the second multivibrator 47, an output signal Q3 on the output 57 of the third multivibrator 48, an output signal Q1n on the output 60 of the first multivibrator 46, an output signal QD2 on the output 64 of the second flip-flop 54, an output signal QD1n on the output 66 of the first flip-flop 53, an output signal Q0 on the output of the OR gate 52 and an output signal QN on the output 69 of the NAND gate 68. t=t0, t1, t2, t3 and t4 indicate some time instants, to the left of the line 1 for f<f2 (for example, f2 = 160 MHz) and to the right of the line 1 for f>f2. Transfer of the switching path 42 around f=f2 is described. If it is assumed that f is initially <f2 and that the frequency divider was not included in the signal path between the inputs 2 and 9 of the triggering system 1, then QN="0". First the situation for f<f2 for QN="0" will be described, in a cycle time of, for example, 7 msec (t4−t1). At t=t1 and edge f1 of the input signal (repetitive signal) is seen by the monostable multivibrators 46, 47 and 48. The monostable multivibrator 46 has a recovery time of 5 μsec (t2−t1), the multivibrator 47 of 1.5 msec (t3−t1) and the multivibrator 48 of 7 msec (t4−t1). The frequency divider 51 is a scale-of-25 circuit. The multivibrators therefore receive a frequency of less than 160 MHz divided by 32 (by the divider circuit 40) and after division by 25 (by the frequency divider 51), a frequency of less than 200 kHz is presented, which corresponds to a time of more than 5 μsec. At t=t2, Q1n will again become "1" owing to the return of the multivibrator 46 to the quiescent state. The second flip-flop 54 consequently receives a clock signal at the clock input 61 at t=t2 and the "0" on the data input 62 is gated to the output 64. At t=t3, the first flip-flop 53 accepts the "0" of the output 64, as a result of which QD1n remains "1". The output signal QN of the NAND gate 68 therefore remains "0" and switching does not take place. As a result of the collapse of Q3 at t4, the circuit is enabled again. It is now assumed that QN="0" and that f>f2; to the right of the line 1, the situation is described for t=t0, t1, t2, t3 and t4. Since a frequency greater than 200 kHz is seen after the frequency divider 51, Q1n is not restored at t=t2. At t=t2 no clock signal will therefore be presented to the second flip-flop 54, with the result that QD2 retains the logic level "1". At t=t3, the "1" of the second flip-flop 54 is gated into the first flip-flop 53 by the second multivibrator 47, with the result that QD1n becomes "0" and QN of the NAND gate 68 becomes "1". Switching takes place, with the result that the switching path 7 is connected to the inputs 2 and 9 of the triggering system 1. The operation of the second switching path 43 is analogous. In it the frequency f1 is detected (for example, f1 = 150 MHz). For f1 = 150 MHz, the frequency presented to the multivibrator 75 is then 150 MHz divided by 128 (signal path 7), divided by 32 (5 ECL scale-of-two circuits)=36.6 kHz, which corresponds to 27.3 μsec. The multivibrator 75 therefore has a recovery time of 27.3 μsec. As a result of first dividing the frequency of the signal before detecting the signal, HCT logic components are adequate and these are cheap and readily obtainable.

Figure 7:
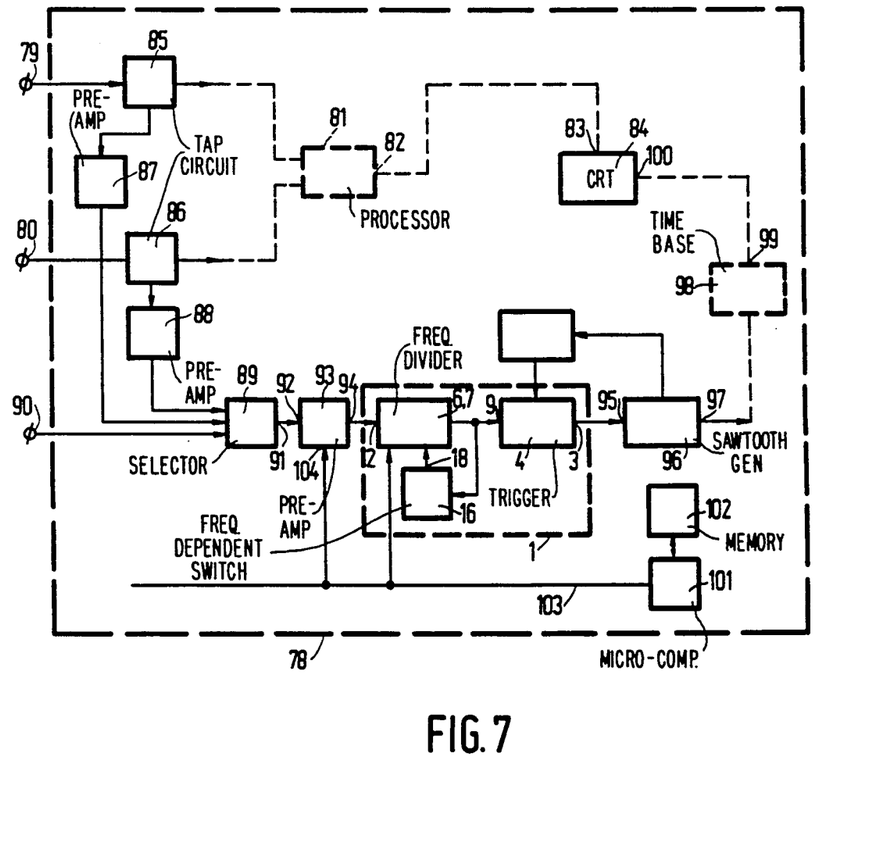
FIG. 7 shows a basic diagram of an oscilloscope having a triggering system according to the invention.

FIG. 7 shows a basic diagram of an oscilloscope 78 having a triggering system 1 according to the invention, in which components corresponding to FIG. 1 are indicated in the same way. The oscilloscope 78 comprises a first input channel 79 and may comprise a second input channel 80. The input channels 79 and 80 are coupled to a processing circuit 81 having an output 82 that is connected to an input 83 for vertical deflection in a display device 84 (for example, a CRT or an LCD display). Furthermore, respective triggering signal tapping circuits 85 and 86 are coupled to the input channels 79 and 80 for tapping of triggering signals for supply to the triggering system 1. The triggering signal tapping circuits 85 and 86 are coupled via respective pre-amplifiers 87 and 88 to a triggering signal selection circuit 89 to which an external triggering channel 90 is furthermore coupled. An output 91 of the triggering signal selection circuit 89 is coupled to an input 92 of a pre-amplifier 93 whose output 94 is coupled to the input 2 of the triggering system 1. The output of the triggering device 4 is coupled to an input 95 of a sawtooth generator 96 having an output 97 that is coupled to a further time base circuit 98. An output 99 of the time base circuit 98 is coupled to an input 100 for horizontal deflection in the display device. The oscilloscope 78 may comprise a microcomputer 101 and a memory 102 with control programmes (not shown) for controlling diverse functions. Thus, the pre-amplifier 93 may be triggered, for example, by the microcomputer 101 via a bus 103 at an input 104 for amplification by 1 or 10. The frequency divider may also be enabled in the triggering system 1 despite an unduly low amplitude of the input signal.

Figure 8:
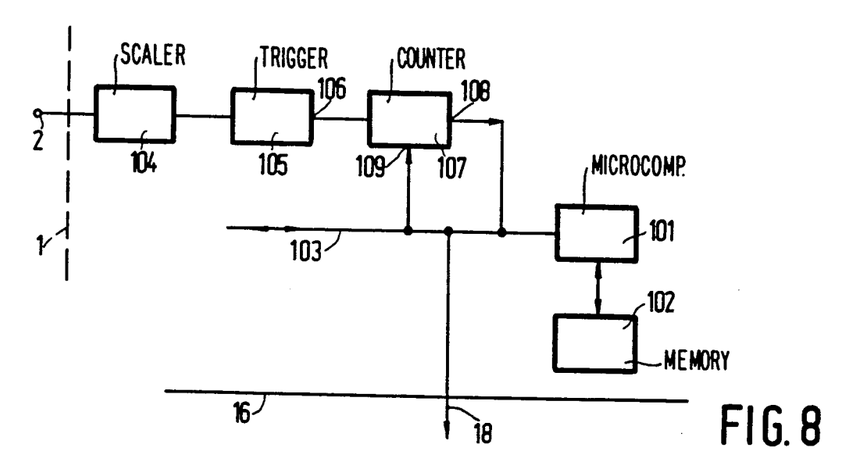
FIG. 8 shows a partial software solution for frequency detection with hysteresis according to the invention.

FIG. 8 shows a partial software solution for frequency detection with hysteresis in which the hardware of the frequency detection circuit 16 is partially designed in the form of software. The input 2 of the triggering system 1 is connected, for example, via a scale-of-32 circuit 104, to a pulse-shaping Schmitt trigger 105 whose output 106 is coupled to a counting circuit 107. An output 108 of the counting circuit is fed to the microcomputer 101. The counting circuit comprises a gate input 109, which can be triggered by the microcomputer 101, for activating the counting circuit for a predetermined time Tg. The microcomputer 101 then reads out the counting circuit. The reading is a measure of the frequency. A control signal equivalent to that on the output 18 of the switching device 16 can be generated for switching the signal paths 6 and 7. This signal is generated with the aid of simple software in the memory 102. If, for example, f1=140 MHz, f2=180 MHz and the maximum frequency is 2 GHz, the respective readings for a gating of 1 $\mu$sec are 4, 6 and 62, with which a distinction in frequency can be made with the software to generate the switching control signal. A cycle time Tc of, for example, 7 msec can easily be incorporated in the software.

Figure 9:
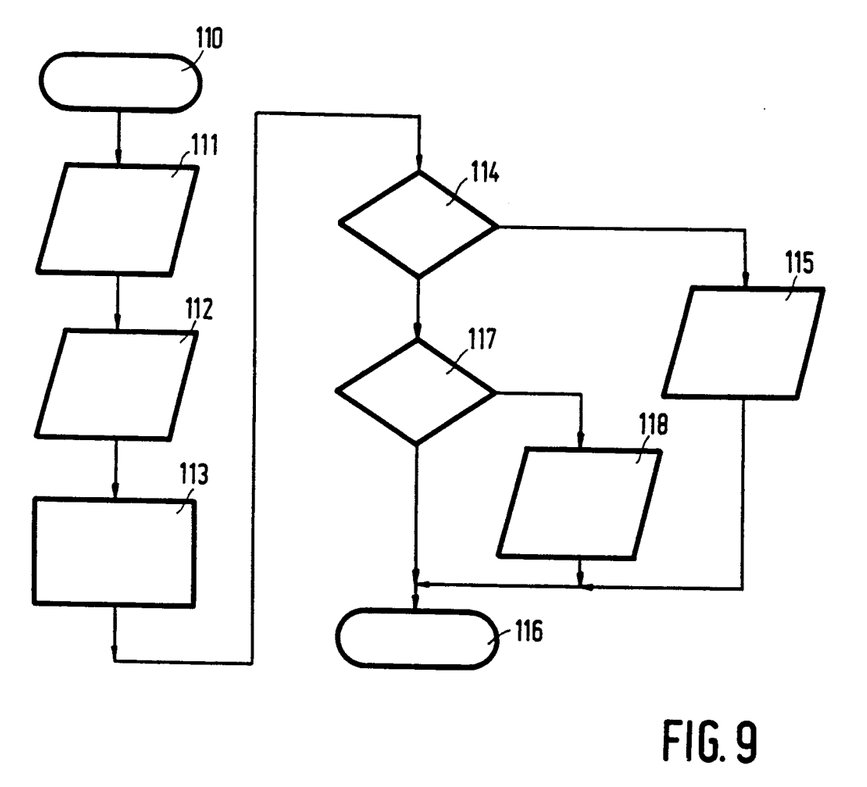
FIG. 9 shows a flow chart of an interrupt service routine for the frequency detection with hysteresis according to the invention.

FIG. 9 shows a flowchart of an interrupt service routine for frequency detection with hysteresis. The interrupt service routine is located in the memory 102. In a main program (not shown) the output 18 initially receives the logic level "0". The main programme is interrupted every Tc seconds (for example, 7 msec) for the interrupt service routine to be carried out by an interrupt signal generated, for example, with a system clock. The interrupt service routine starts in block 110. A write command 111 in the interrupt service routine activates the gate input 109 of the counting circuit 107 (the counting circuit is reset at the same time). After a time t=Tg (for example 1 $\mu$sec), a reading at the output 108 is supplied via the bus 103 to the interrupt service routine by a reader command 112. The reading is a measure of the frequency f of a measured signal. In block 113, the interrupt service routine determines the frequency f of the measured signal from the reading. The frequency f of the measured signal is compared in a comparison command 114 with a frequency f=f1. If f<f1, the output 18 receives the logic level "0" and the main programme is returned to in block 116. Alternatively, in a comparison command 117, the frequency f of the measured signal is compared with a frequency f=f2. If f>f2, the output 18 acquires the logic level "1" with the write command 118 and the main programme is returned to in the block 116. Alternatively, there is a return to the main programme.

We claim:

1. A system for triggering an oscilloscope comprising:
   an input terminal for a repetitive trigger signal,
   a first signal path,
   a second signal path parallel to the first signal path and which includes a first frequency division device for dividing the frequency of the trigger signal applied thereto,
   a trigger device for generating triggering pulses for said oscilloscope when the repetitive trigger signal is supplied thereto, and
   switching means for selectively switching said first and second signal paths between said input terminal and an input of said trigger device, wherein the switching means further comprises at least one frequency-dependent switching device responsive to the trigger signal for switching the signal paths depending on the frequency of the trigger signal.

2. A triggering system according to claim 1, wherein frequency operating ranges of the trigger device and the first frequency division device overlap each other and in that said switching means includes a first switching device that switches an input signal of the triggering system from the first signal path which is without a frequency division device to the second signal path containing the first frequency division device, and vice versa, at respective frequencies of the input trigger signal which lie within the overlapping frequency operating ranges.

3. A triggering system according to claim 2, further comprising a third signal path containing a second frequency division device and selectively switchable by said switching means between said input terminal and said input of the trigger device, wherein frequency operating ranges of the first frequency division device and the second frequency division device overlap each other and in that said switching means includes a second switching device that switches the input trigger signal from the second signal path to the third signal path, and vice versa, at respective frequencies of the input trigger signal which lie within the overlapping frequency operating ranges of the first and second frequency division devices.

4. A triggering system according to claim 1, wherein the switching device comprises a frequency detection device having an input for receiving a signal formed from the input trigger signal and having an output for controlling a first and a second switch for switching the first and second signal paths, the frequency detection device exhibiting frequency hysteresis.

5. A triggering system according to claim 4, wherein the signal supplied to the frequency detection device is formed from an input signal of the trigger device.

6. A triggering system according to claim 4, wherein the frequency detection device comprises a switch device coupled to an input of the frequency detection device and which is coupled to a first and a second frequency-dependent switching path, respective outputs of the switching paths being connected to respective inputs of a gate circuit having an output which provides a control signal for controlling the switch device.

7. A triggering system according to claim 6, wherein the control signal assumes a first signal value if a first frequency is exceeded in the first switching path and the control signal assumes a second signal value if a second frequency is not reached in the second switching path, the first and the second signal values determining two respective states of the switch device.

8. A triggering system according to claim 6, wherein the respective first and second frequency-dependent switching paths comprise a first monostable multivibrator having an input coupled to the input of the frequency detection device and a second and a third monostable multivibrator coupled to the input of the frequency detection device via an OR gate, and output of the first multivibrator determining a state of the control signal, which state is gated, at an instant in time determined by the second multivibrator, into a memory element which is coupled to the first and the second multivibrator and to an output of the first switching path, and means coupling an output of the third multivibrator to an input of the OR gate, said third multivibrator determining a cycle time of the frequency detection device.

9. A triggering system according to claim 1, wherein the frequency division device comprises at least one bandpass type frequency divider connected serially between an input and an output of the frequency division device.

10. A triggering system according to claim 2, wherein the switching device comprises a frequency detection device having an input for receiving a signal formed from the input trigger signal and having an output for controlling a first and a second switch for switching the first and second parallel signal paths, the frequency detection device exhibiting frequency hysteresis.

11. A triggering system according to claim 10, wherein the frequency detection device comprises a switch device coupled to an input of the frequency detection device and which is coupled to a first and a second frequency-dependent switching path, respective outputs of the switching paths being connected to respective inputs of a gate circuit having an output which provides a control signal for controlling the switch device.

12. A system for triggering an oscilloscope comprising:
an input terminal for a repetitive trigger signal that covers a given frequency range,
a trigger device for generating triggering pulses for said oscilloscope when the repetitive trigger signal is supplied thereto, said trigger device having a limited frequency range which is less than the given frequency range of the repetitive trigger signal,
a first signal path,
a second signal path for extending the effective frequency range of the trigger device and parallel to the first signal path and which includes a first frequency division device for dividing the frequency of the trigger signal applied thereto,
switching means for selectively switching said first and second signal paths between said input terminal and an input of said trigger device.

13. A triggering system according to claim 12, wherein the frequency division device comprises at least one bandpass type frequency divider connected serially between an input and an output of the frequency division device.

14. An oscilloscope comprising:
a display device,
a horizontal deflection circuit coupled to said display device,
a vertical deflection circuit coupled to said display device,
at least one input signal channel for a repetitive trigger signal that covers a given frequency range,
a triggering system having an input terminal coupled to said at least one input signal channel and having a trigger device for generating trigger pulses from the received repetitive trigger signal and with an output of said trigger device coupled to an input of said horizontal deflection circuit, said trigger device having a limited frequency range which is less than the given frequency range of the repetitive trigger signal, and wherein said triggering system further comprises:
a first signal path,
a second signal path for extending the effective frequency range of the trigger device and which includes a first frequency division device for dividing the frequency of the trigger signal applied thereto, and
means for selectively switching said first and second signal paths between said input terminal and an input of said trigger device.

15. A system for triggering a load device, said system comprising:
an input terminal for a periodic trigger signal that covers a given frequency range,
a first signal path,
a second signal path, separate from the first signal path, and which includes a frequency division device for dividing the frequency of the periodic signal applied thereto,
a trigger device for deriving triggering pulses for the load device, said trigger device having a limited frequency range which is less than the given frequency range of the periodic signal at the input terminal, and
means responsive to a signal determined by the periodic trigger signal at the input terminal for selectively switching said first and second signal paths between said input terminal and an input of said trigger device as a function of the frequency of said periodic input trigger signal.

16. A triggering system as claimed in claim 15 wherein said frequency division device has a frequency range that partly overlaps said limited frequency range of the trigger device and said switching means switches between said first and second signal paths at a frequency of the input trigger signal which falls within the partly overlapping frequency ranges.

17. A triggering system as claimed in claim 16 further comprising a third signal path including a second frequency division device and selectively switchable by said switching means between said input terminal and said input of the trigger device, and wherein said second frequency division device has a frequency range that partly overlaps the frequency range of the first frequency division device and said switching means selectively switches between said second and third signal paths at a frequency of the input trigger signal which falls within the partly overlapping frequency ranges of the first and second frequency division devices.

18. A triggering system as claimed in claim 15 wherein said switching means includes a frequency detection circuit having an input coupled to an input of the trigger device and an output for controlling a switch for switching between said first and second signal paths as a function of the frequency of a signal at the input of the trigger device.

* * * * *

UNITED STATES PATENT AND TRADEMARK OFFICE
CERTIFICATE OF CORRECTION

PATENT NO. : 5,063,302
DATED : November 5, 1991
INVENTOR(S) : Wilhelmus D.H., et. al.

It is certified that error appears in the above-indentified patent and that said Letters Patent is hereby corrected as shown below:

Column 10, Claim 15, line 3, delete "trigger";
line 16, delete "trigger";
line 20, delete "trigger";

Column 10, Claim 16, line 6, change "input trigger" to --periodic input--.
Column 10, Claim 17, line 10, change "imput trigger" to--periodic input--.

Signed and Sealed this

Thirtieth Day of November, 1993

Attest:

BRUCE LEHMAN

Attesting Officer

Commissioner of Patents and Trademarks